US012718854B2

(12) United States Patent
Chang et al.

(10) Patent No.: US 12,718,854 B2
**(45) Date of Patent: *Aug. 25, 2026**

(54) REDUCING CAPACITIVE LOADING OF MEMORY SYSTEM BASED ON SWITCHES

(71) Applicant: Taiwan Semiconductor Manufacturing Company, Ltd., Hsinchu (TW)

(72) Inventors: Meng-Sheng Chang, Chu-bei City (TW); Chia-En Huang, Xinfeng Township (TW); Yi-Ching Liu, Hsinchu City (TW); Yih Wang, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 237 days.

This patent is subject to a terminal disclaimer.

(21) Appl. No.: 18/446,999

(22) Filed: Aug. 9, 2023

(65) Prior Publication Data

US 2023/0386538 A1 Nov. 30, 2023

Related U.S. Application Data

(63) Continuation of application No. 17/460,216, filed on Aug. 28, 2021, now Pat. No. 11,823,769.

(51) Int. Cl.
*G11C 7/12* (2006.01)
*G11C 5/02* (2006.01)
(Continued)

(52) U.S. Cl.
CPC ................ *G11C 7/12* (2013.01); *G11C 5/025* (2013.01); *G11C 5/14* (2013.01); *H10D 88/00* (2025.01)

(58) Field of Classification Search
CPC .. G11C 7/12; G11C 5/025; G11C 5/14; H10D 88/00
(Continued)

(56) References Cited

U.S. PATENT DOCUMENTS 11,238,904 B1 * 2/2022 Yu ............................ G11C 7/18
11,404,099 B1 * 8/2022 Wang .................... G11C 11/223
(Continued)

FOREIGN PATENT DOCUMENTS

TW 202101679 A 1/2021

OTHER PUBLICATIONS

Non-Final Office Action on U.S. Appl. No. 17/460,216 Dtd Mar. 3, 2023.
(Continued)

*Primary Examiner* — Connie C Yoha
(74) *Attorney, Agent, or Firm* — Foley & Lardner LLP

(57) ABSTRACT

Disclosed herein are related to a memory array. In one aspect, the memory array includes a first set of memory cells including a first subset of memory cells and a second subset of memory cells. In one aspect, the memory array includes a first switch including a first electrode connected to first electrodes of the first subset of memory cells, and a second electrode connected to a first global line. In one aspect, the memory array includes a second switch including a first electrode connected to first electrodes of the second subset of memory cells, and a second electrode connected to the first global line.

20 Claims, 11 Drawing Sheets

(51) Int. Cl.
*G11C 5/14* (2006.01)
*H10D 88/00* (2025.01)

(58) Field of Classification Search
USPC .................................................... 365/189.011
See application file for complete search history.

(56) References Cited

U.S. PATENT DOCUMENTS

| | | | | |
|---|---|---|---|---|
| 11,823,769 | B2 * | 11/2023 | Chang | G11C 5/025 |
| 12,027,204 | B2 * | 7/2024 | Chang | G11C 13/003 |
| 2009/0029511 | A1 | 1/2009 | Wu | |
| 2021/0350847 | A1 * | 11/2021 | Fujiwara | G11C 11/419 |
| 2022/0028439 | A1 | 1/2022 | Liu et al. | |

OTHER PUBLICATIONS

Notice of Allowance on U.S. Appl. No. 17/460,216 Dtd Jul. 26, 2023.

Office Action issued in Taiwan Appl. No. 111124737 dated Mar. 5, 2026.

* cited by examiner

210A

S1_SBL[0]
S1_WL[0] [F-1]
S1_WL[0] [F-2]
S1_WL[0] [1]
S1_WL[0] [0]
S1_SSL[0]

210B

S0_SBL[0]
S0_WL[0] [F-1]
S0_WL[0] [F-2]
S0_WL[0] [1]
S0_WL[0] [0]
S0_SSL[0]

GSL[0]

BL[0]
BL[1]
BL[C-2]
BL[C-1]
SL[0]
SL[1]
SL[C-2]
SL[C-1]

600

700

REDUCING CAPACITIVE LOADING OF MEMORY SYSTEM BASED ON SWITCHES

CROSS-REFERENCE TO RELATED APPLICATION

This application is a continuation of U.S. patent application Ser. No. 17/460,216, filed Aug. 28, 2021, and titled "REDUCING CAPACITIVE LOADING OF MEMORY SYSTEM BASED ON SWITCHES," the entire contents of which are incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
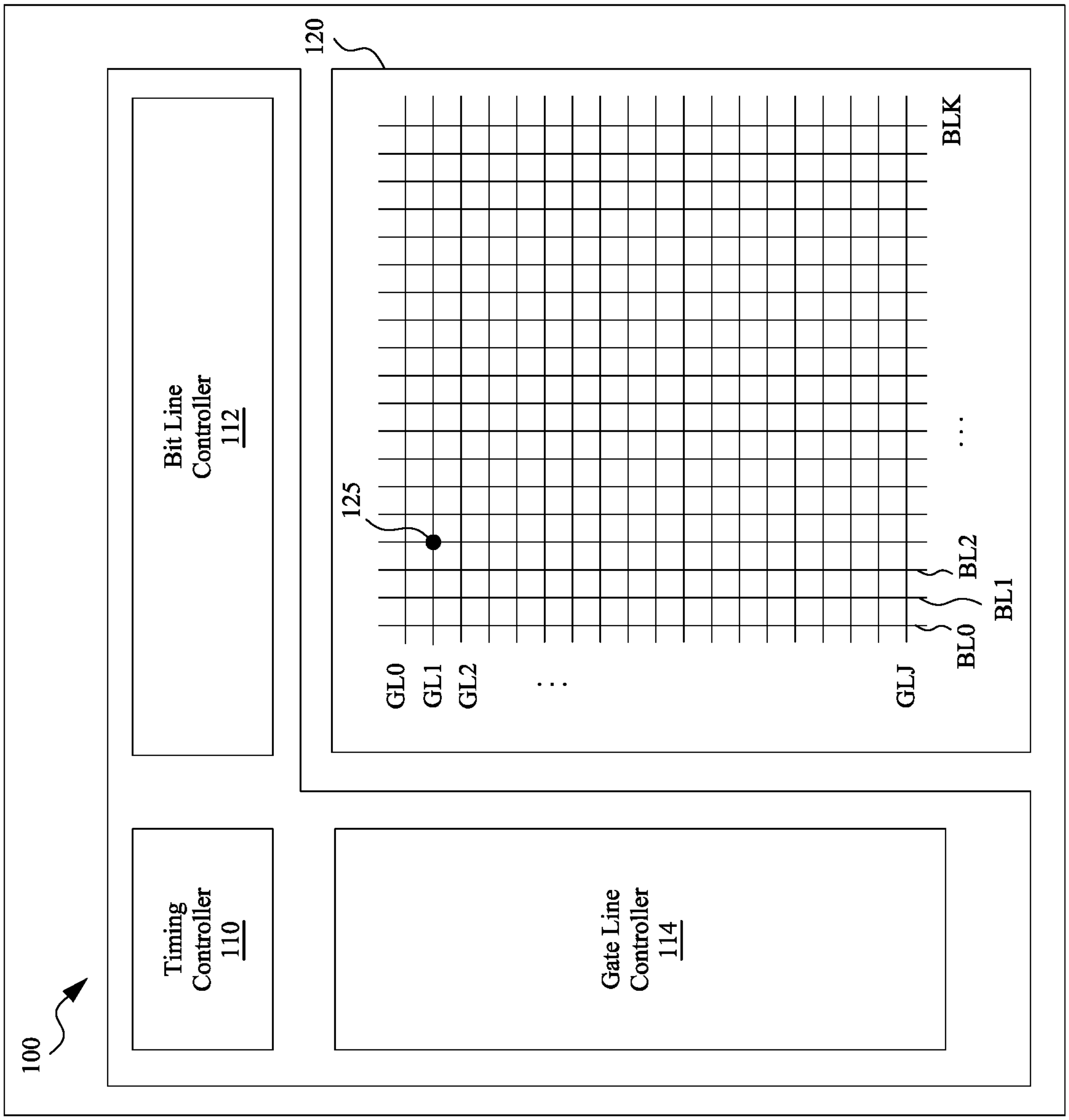
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes one or more switches to couple or decouple local lines to a global line. A local line may be a metal rail, to which two or more memory cells are connected. For example, a local line may be a local select line, to which first electrodes (e.g., drain (or source) electrodes) of memory cells are connected. For example, a local line may be a local bit line, to which second electrodes (e.g., source (or drain) electrodes) of the memory cells are connected. A global line may be a metal rail, to which one or more of selected local lines can be electrically coupled through switches. For example, a global line may be a global select line, to which two or more local select lines can be electrically coupled through switches. For example, a global line may be a global bit line, to which two or more local bit lines can be electrically coupled through switches.

Advantageously, the memory system employing the disclosed switches can achieve several benefits. In one aspect, switches between a global line and local lines can be individually configured or operated to electrically couple or decouple respective local lines to the global line. By coupling a selected local line to a global line, a subset of a set of memory cells connected to the selected local line can be electrically coupled to the global line while the other subset of the set of memory cells connected to unselected local lines can be electrically decoupled from the global line. Hence, the global line may have a capacitive loading corresponding to the selected subset of the set of memory cells instead of a capacitive loading corresponding to the entire set of memory cells. Accordingly, the set of memory cells having a large number of memory cells can be configured or operated through a global line with a low capacitive loading corresponding to the subset of the set of memory cells. By reducing the capacitive loading, operating speed of the memory system can be improved. Moreover, by reducing the capacitive loading, power consumption of the memory system can be reduced.

FIG. 1 is a diagram of a memory system 100, in accordance with one embodiment. In some embodiments, the memory system 100 is implemented as an integrated circuit. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. In some embodiments, the memory array 120 includes gate lines GL0, GL1 . . . GLJ, each extending in a first direction and bit lines BL0, BL1 . . . BLK, each extending in a second direction. The gate lines GL and the bit lines BL may be conductive metals or conductive rails. Each gate line GL may include a word line and control lines. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a non-volatile memory cell. In some embodiments, the memory array 120 includes additional lines (e.g., sense lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more sense lines. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL and sense lines of the memory array 120, and the gate line controller 114 may be connected to gate lines GL of the memory array 120. In one example, to write data to a memory cell 125, the gate line controller 114 applies a voltage or current to the memory cell 125 through a gate line GL connected to the memory cell 125, and the bit line controller 112 applies a voltage or current corresponding to data to be stored to the memory cell 125 through a bit line BL connected to the memory cell 125. In one example, to read data from a memory cell 125, the gate line controller 114 applies a voltage or a current to the memory cell 125 through a gate line GL connected to the memory cell 125, and the bit line controller 112 senses a voltage or current corresponding to data stored by the memory cell 125 through a sense line or a bit line connected to the memory cell 125. In some embodiments, the memory controller 105 includes more, fewer, or different components than shown in FIG. 1.

Figure 2:
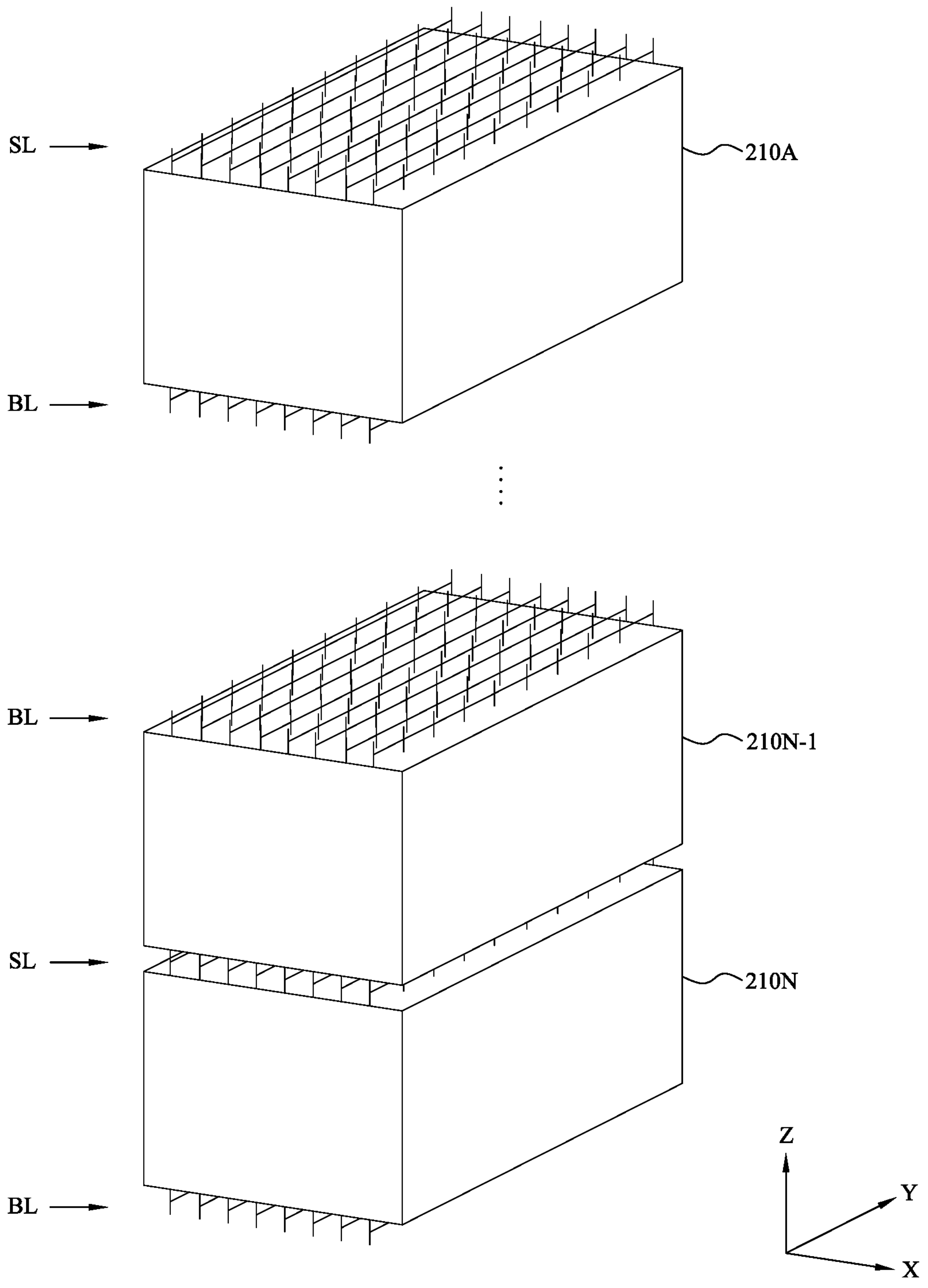
FIG. 2 is a diagram showing three-dimensional memory arrays, in accordance with one embodiment.

FIG. 2 is a diagram showing three-dimensional memory arrays 210A . . . 210N, in accordance with one embodiment. In some embodiments, the memory array 120 includes the memory arrays 210A . . . 210N. Each memory array 210 includes a plurality of memory cells 125 arranged in a three-dimensional array. In some embodiments, each memory array 210 may include a same number of memory cells 125. In some embodiments, two or more memory arrays 210 may include different numbers of memory cells 125. In one configuration, the memory arrays 210A . . . 210N are stacked along a Z-direction. Each memory array 210 may have bit lines BL on one side of the memory array 210 and have select lines SL on an opposite side of the memory array 210. In some embodiments, two adjacent memory arrays 210 may share select lines SL. In some embodiments, two adjacent memory arrays 210 may share bit lines BL. For example, memory arrays 210N−1, 210N share or are electrically coupled to a set of select lines SL. For example, memory arrays 210N−2, 210N−1 share or are electrically coupled to a set of bit line BL. By sharing select lines SL and/or bit lines BL, a number of drivers of the memory controller 105 to apply signals through the select lines SL and/or bit lines BL can be reduced to achieve area efficiency. In some embodiments, the memory array 120 includes additional memory arrays that may have separate select lines SL and/or bit lines BL than shown in FIG. 2.

Figure 3:
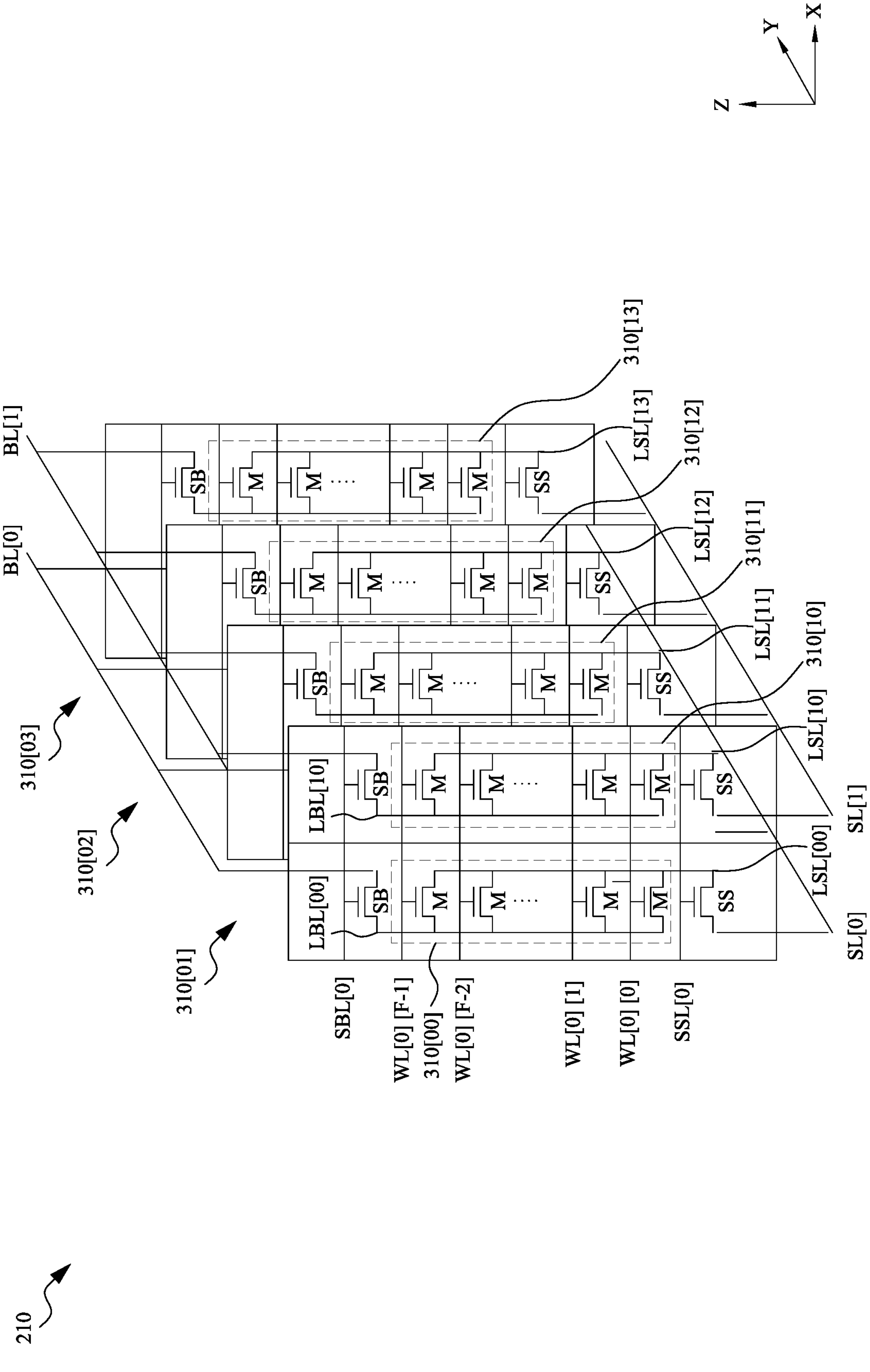
FIG. 3 is a diagram showing three-dimensional memory arrays including switches to reduce capacitive loading, in accordance with one embodiment.

FIG. 3 is a diagram showing a portion of a three-dimensional memory array 210 including switches SS, SB to reduce capacitive loading, in accordance with one embodiment. In FIG. 3, the memory array 210 includes a first set of memory cells and a second set of memory cells. In one configuration, the first set of memory cells includes subsets 310[00] . . . 310[03] of memory cells that may be electrically coupled to a global bit line BL[0] and a global select line SL[0] extending along a Y-direction. In one configuration, the second set of memory cells includes subsets 310[10] . . . 310[13] of memory cells that may be electrically coupled to a global bit line BL[1] and a global select line SL[1] extending along the Y-direction. Each subset 310 of memory cells may include F number of memory cells M (memory cell 125) disposed along a Z-direction. Each set of memory cells may include a larger number of subsets 310 of memory cells than shown in FIG. 3 along the Y-direction. The memory array 210 may include a larger number of sets of memory cells than shown in FIG. 3 stacked along the X-direction. By arranging memory cells as shown in FIG. 3, a storage density of the memory array 210 can be increased.

In one configuration, each subset 310 of memory cells includes F number of memory cells M disposed along the Z-direction. Each memory cell M may be a volatile memory cell, a non-volatile memory cell, or any memory cell that can store data. Each memory cell M may be embodied as a transistor (e.g., MOSFET, GAAFET, FinFET, etc.). Each memory cell M may include a first electrode (e.g., drain electrode) coupled to a local select line LSL, a second electrode (e.g., source electrode) coupled to a local bit line LBL, and a third electrode (e.g., gate electrode) coupled to a corresponding word line WL[X][Z]. Each memory cell M may store data or conduct current according to a voltage applied to a gate electrode of the memory cell M. A word line WL[X][Y] may extend along the X-direction to connect gate electrodes of corresponding memory cells M in different sets to the memory controller (e.g., gate line controller 114). In one configuration, a subset 310 of memory cells M are connected in parallel between a local select line LSL and a local bit line LBL. A local select line LSL may be a metal rail, at which first electrodes (e.g., drain electrodes) of a subset 310 of memory cells are connected. A local bit line LBL may be a metal rail, at which second electrodes (e.g., source electrodes) of a subset 310 of memory cells are connected. The local select line LSL may extend along the Z-direction and connect to a corresponding switch SS. Similarly, the local bit line LBL may extend along the Z-direction and connect to a corresponding switch SB.

Each switch SB may be embodied as a transistor (e.g., MOSFET, GAAFET, FinFET, etc.). Each switch SB may include a first electrode (e.g., drain electrode) connected to the local bit line LBL, a second electrode (e.g., source electrode) connected to a corresponding global bit line BL, and a third electrode (e.g., gate electrode) connected to a corresponding switch control line SBL. The switch control line SBL may be a metal rail extending along the X-direction to connect the memory controller 105 (e.g., gate line controller 114) to the gate electrodes of switches SB. According to a voltage or a signal applied through the switch control line SBL, one or more switches SB connected to the switch control line SBL may be enabled or disabled. For example, in response to a voltage corresponding to logic state '1' provided through the switch control line SBL, a switch SB may be enabled to electrically couple second electrodes (e.g., source electrodes) of the subset 310 of memory cells to the global bit line BL. For example, in response to a voltage corresponding to logic state '0' provided through the switch control line SBL, the switch SB may be disabled to electrically decouple second electrodes (e.g., source electrodes) of the subset 310 of memory cells from the global bit line BL.

Each switch SS may be embodied as a transistor (e.g., MOSFET, GAAFET, FinFET, etc.). The switch SS may include a first electrode (e.g., source electrode) connected to the local select line LSL, a second electrode (e.g., drain electrode) connected to a corresponding global select line SL, and a third electrode (e.g., gate electrode) connected to a corresponding switch control line SSL. The switch control line SSL may be a metal rail extending along the X-direction to connect the memory controller 105 (e.g., gate line controller 114) to the gate electrodes of switches SS. According to a voltage or a signal applied through the switch control line SSL, one or more switches SS connected to the switch control line SSL may be enabled or disabled. For example, in response to a voltage corresponding to logic state '1' provided through a switch control line SSL, the switch SS may be enabled to electrically couple first electrodes (e.g., drain electrodes) of the subset 310 of memory cells to the global select line SL. For example, in response to a voltage corresponding to logic state '0' provided through the switch control line SSL, the switch SS may be disabled to electrically decouple first electrodes (e.g., drain electrodes) of the subset 310 of memory cells from the global select line SL.

In one configuration, the global select line SL is a metal rail, at which corresponding switches SS are connected. The global select line SL may extend along the Y-direction. In one implementation, the global select line SL may be connected to a memory controller 105 (e.g., bit line controller 112). The global bit line BL may be a metal rail, at which corresponding switches SB are connected. The global bit line BL may extend along the Y-direction in parallel with the global select line SL. In one implementation, the global bit line BL may be connected to the memory controller 105 (e.g., bit line controller 112).

In one configuration, the switches SB, SS can be operated or configured according to a voltage or signal from the memory controller 105 (e.g., gate line controller 114) to electrically couple a subset 310 of memory cells to corresponding global lines BL, SL selectively. For example, from a set 310[X0] . . . 310[X3] of memory cells connected to local select lines LSL[X0] . . . LSL[X3] and local bit lines LBL[X0] . . . LBL[X3], a subset 310[XY] of memory cells connected to a local select line LSL[XY] and a local bit line LBL[XY] can be electrically coupled to the global bit line BL[X] and the global select line SL[X] through selected switches SB, SS. Meanwhile, other subsets 310 of memory cells connected to other local select lines LSL and local bit lines LBL can be electrically decoupled from the global bit line BL[X] and the global select line SL[X]. By electrically coupling a selected subset 310[XY] of memory cells to the global bit line BL[X] and the global select line SL[X] through the switches SB, SS, the global bit line BL[X] and the global select line SL[X] may have a capacitive loading corresponding to the selected subset 310[XY] of memory cells instead of the set 310[X0] . . . 310[X3] of memory cells. Accordingly, the global bit lines BL[X] and the global select lines SL[X] may be implemented to provide voltages or current with reduced capacitive loading. By reducing capacitive loading, memory cells M can be operated or configured with improved speed and/or lower power consumption.

In one configuration, the switch control lines SSL[Y], SBL[Y] are connected to a same driver. In this configuration, the switches SB, SS connected to the switch control lines SSL[Y], SBL[Y] can be simultaneously enabled or disabled according to a voltage, current, or pulse from the driver. By implementing the same driver to configure or operate the switches SB, SS, a number of drivers can be reduced to achieve area efficiency.

In some embodiments, the memory array 210 includes either one of the switches SB, SS, but may lack the other of the switches SB, SS. For example, the memory array 210 includes the switches SB as shown in FIG. 3, where the switches SS are omitted and local select lines LSL[X0], LSL[X1], LSL[X2], LSL[X3] are connected to corresponding global select lines SL[X]. For example, the memory array 210 includes the switches SS as shown in FIG. 3, where the switches SB are omitted and local bit lines LBL[X0], LBL[X1], LBL[X2], LBL[X3] are connected to corresponding global bit lines BL[X]. The switches SS or SB can be configured or operated to electrically couple or decouple the subset 310 of memory cells to a corresponding global line selectively.

Figure 4A:
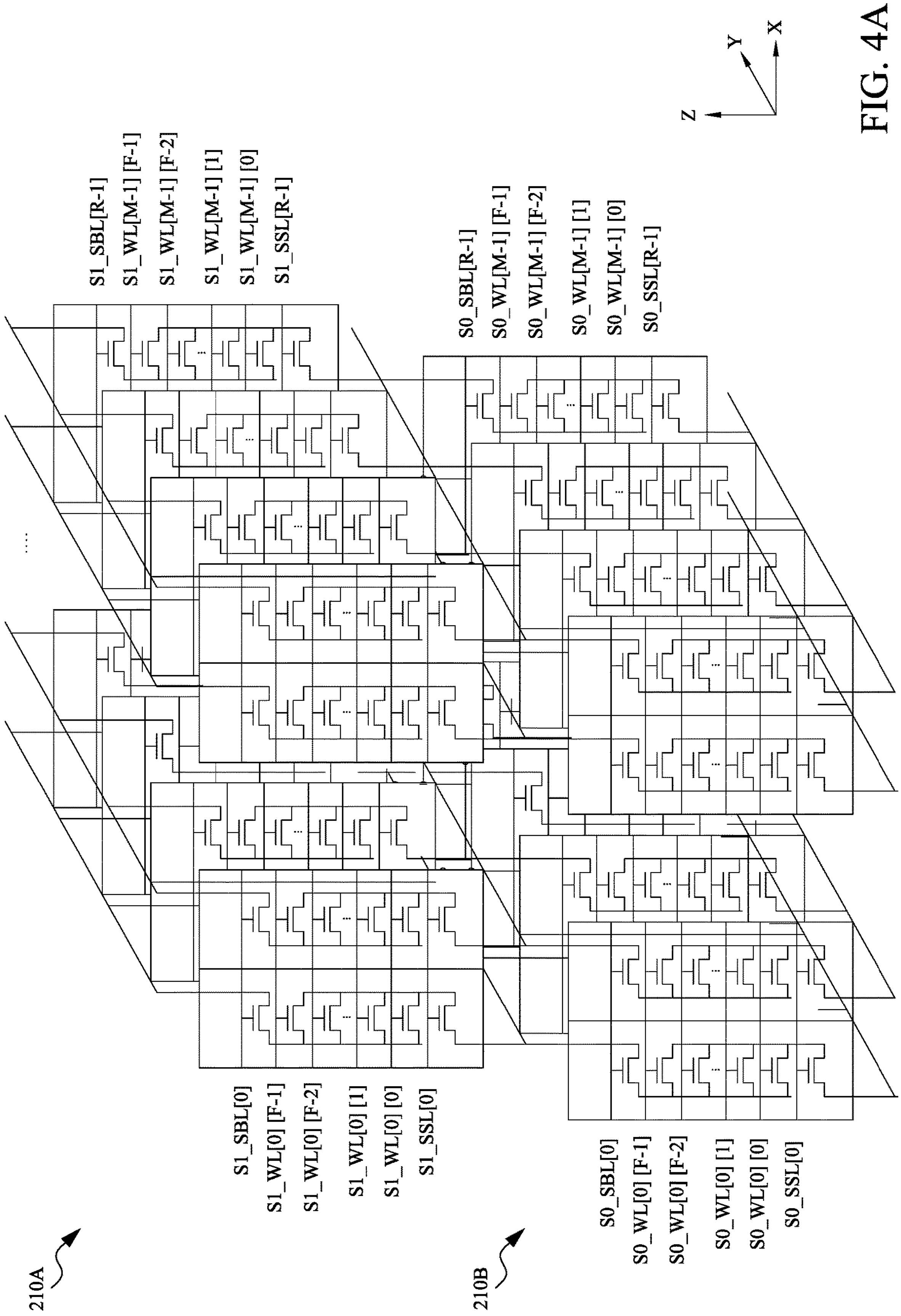
FIG. 4A is a diagram showing two three-dimensional memory arrays, in accordance with one embodiment.

FIG. 4A is a diagram showing two three-dimensional memory arrays 210A, 210B, in accordance with one embodiment. In some embodiments, the memory arrays 210A, 210B have same number of memory cells. For example, the memory array 210A has F number of stacks of memory cells along the Z-direction, where the memory array 210B has F number of stacks of memory cells along the Z-direction. In one aspect, the memory arrays 210A, 210B may be disposed along the Z-direction, where the memory arrays 210A, 210B may share the global bit lines BL. The global bit lines BL may be connected or routed to the bit line controller 112. By sharing the global bit lines BL of two memory arrays 210A, 210B, an area efficiency can be achieved.

Figure 4B:
FIG. 4B is a diagram showing two three-dimensional memory arrays, in accordance with one embodiment.

FIG. 4B is a diagram showing two three-dimensional memory arrays 210A, 210B, in accordance with one embodiment. In some embodiments, the memory arrays 210A, 210B have different number of memory cells. For example, the memory array 210A has F number of stacks of memory cells along the Z-direction, where the memory array 210B has E number of stacks of memory cells along the Z-direction. As shown in FIG. 4B, different memory arrays 210A, 210B having different sizes or different number of memory cells can be arranged to share global bit lines BL or global select lines SL to achieve area efficiency.

Figure 5:
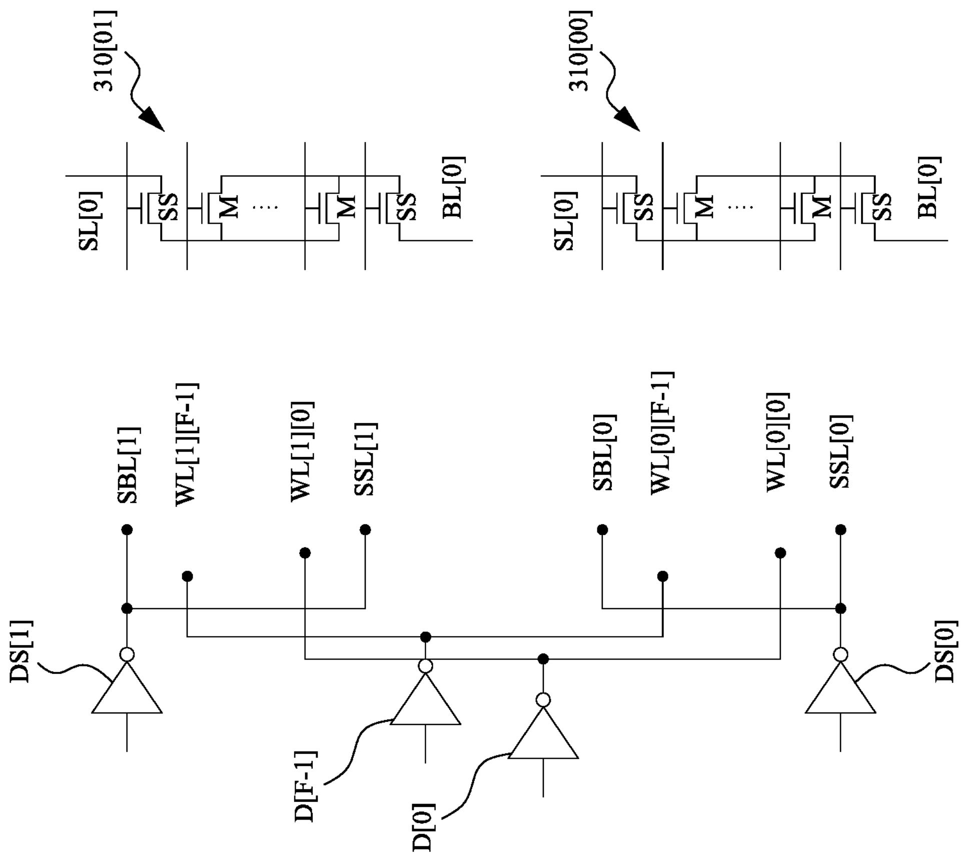
FIG. 5 is a diagram showing drivers to drive the two or more switches, in accordance with one embodiment.

FIG. 5 is a diagram showing drivers DS[0], DS[1], D[0] . . . D[F−1], in accordance with one embodiment. The drivers DS[0], DS[1], D[0] . . . D[F−1] may be part of the gate line controller 114. In one aspect, the drivers DS[0], DS[1], D[0] . . . D[F−1] are connected to two or more switches or two or more memory cells to achieve area efficiency.

In one configuration, gate electrodes of the switches SS, SB connected to a subset 310[01] of memory cells are connected to an output of a driver DS[1] through switch control lines SSL[1], SBL[1]. In one configuration, gate electrodes of the switches SS, SB connected to a subset 310[00] of memory cells are connected to an output of a driver DS[0] through switch control lines SSL[0], SBL[0]. By sharing a driver DS to drive switches SS, SB for the same subset 310 of memory cells rather than implementing separate drivers to drive the switches SS, SB, a number of drivers can be reduced to achieve area efficiency.

In one configuration, a gate electrode of each memory cell in the subset 310[00] of memory cells and a gate electrode of a corresponding memory cell in the subset 310[01] of memory cells are connected to an output of a driver D[X] through word lines WL. For example, a gate electrode of a first memory cell in the subset 310[00] of memory cells and a gate electrode of a first memory cell in the subset 310[01] of memory cells are connected to an output of the driver D[0] through word lines WL[0][0], WL[1][0]. For example, a gate electrode of a Fth memory cell in the subset 310[00] of memory cells and a gate electrode of a Fth memory cell in the subset 310[01] of memory cells are connected to an output of the driver D[F−1] through word lines WL[0][F−1], WL[1][F−1]. Although two subsets 310[01], 310[00] of memory cells are shown in FIG. 5, the output of each driver D may be connected to additional memory cells in other subsets (e.g., 310[02], 310[03]) through word lines. By sharing a driver D to drive multiple memory cells in different subsets 310 of memory cells, a number of drivers can be reduced to achieve area efficiency.

Figure 6:
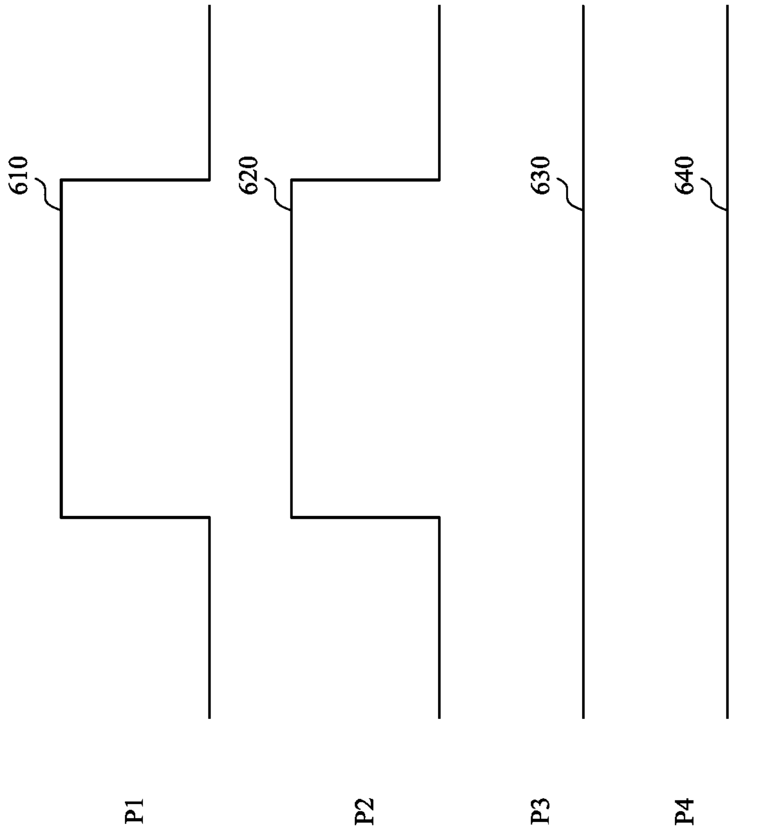
FIG. 6 is a diagram showing pulses applied to switches of memory arrays, in accordance with one embodiment.

FIG. 6 is a timing diagram 600 showing pulses P1, P2, P3, P4 for operating the memory array 120, in accordance with one embodiment. In some embodiments, the pulses P1, P2, P3, P4 are generated by the memory controller 105 (e.g., gate line controller 114).

In one approach, the pulse P1 is applied to gate electrodes of switches SS, SB connected to a selected subset 310 of memory cells, and the pulse P3 is applied to gate electrodes of switches SS, SB connected to unselected subsets 310 of memory cells. By applying the pulse P1 having a high voltage 610, the switches SS, SB connected to the selected subset 310 of memory cells can be enabled to electrically couple the selected subset 310 of memory cells to the global select line SL and the global bit line BL. Meanwhile, by applying the pulse P3 having a low voltage 630, the switches SS, SB connected to the unselected subsets 310 of memory cells can be disabled to electrically decouple the unselected subset 310 of memory cells from the global select line SL and the global bit line BL. Accordingly, the global select line SL and the global bit line BL may have a capacitive loading corresponding to the selected subset of memory cells, rather than the entire set of memory cells.

In one approach, the pulse P2 is applied to a gate electrode or a word line WL of a selected memory cell, and the pulse P4 is applied to gate electrodes or word lines WL of unselected memory cells. By applying the pulse P2 having a high voltage 620, the selected memory cell may be programmed or conduct current corresponding to programmed data. Meanwhile, by applying the pulse P4 having a low voltage 640, the unselected memory cells can be disabled from being programmed or conducting current. Accordingly, the selected memory cell from a subset 310 of memory cells can be individually programmed or operated.

Figure 7:
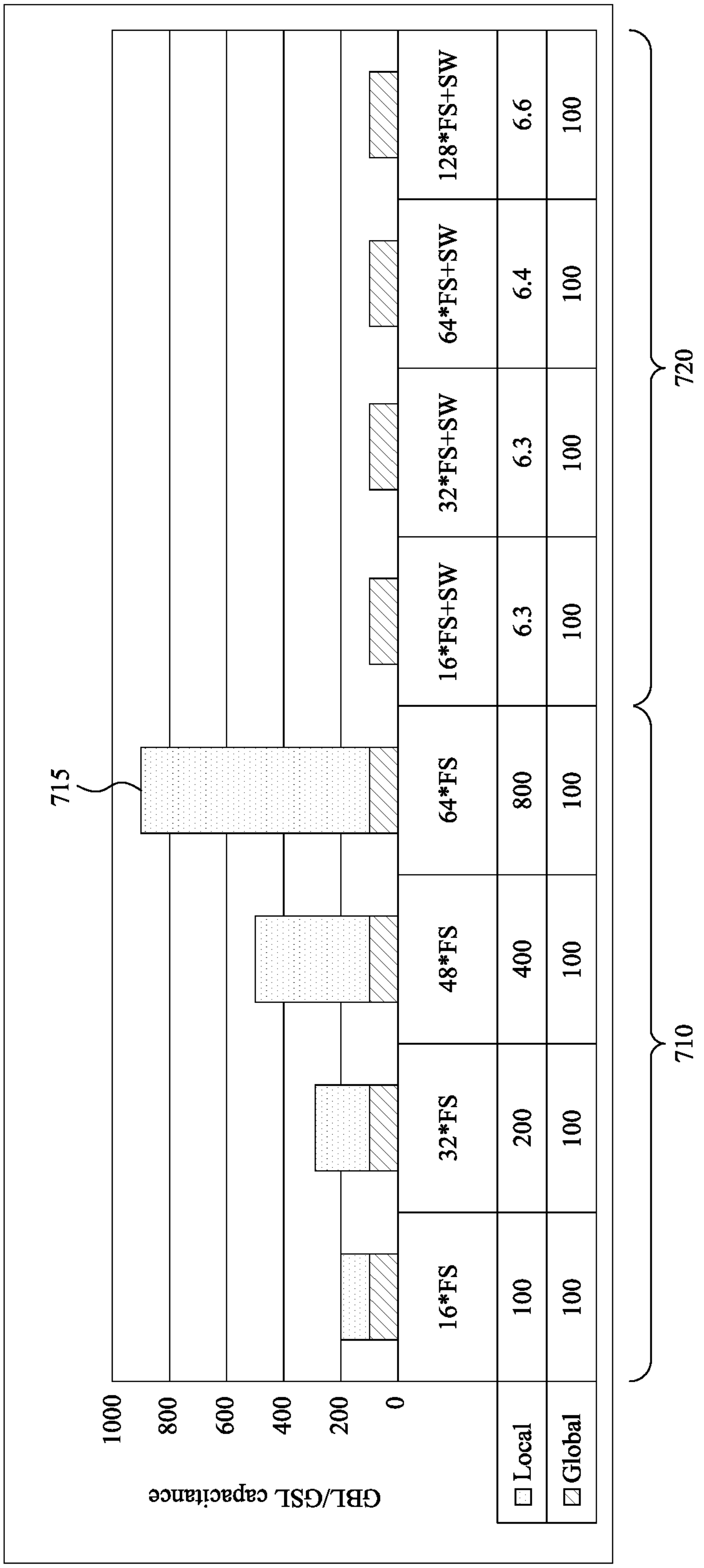
FIG. 7 is a plot showing effects of reduced capacitive loading due to switches, in accordance with one embodiment.

FIG. 7 is a plot 700 showing effects of reduced capacitive loading due to switches SS, SB, in accordance with one embodiment. F may indicate a number of memory cells in a subset of memory cells along the Z-direction. S may indicate a number of sets of memory cells along the X-direction (or a number of global select lines SL). In one aspect, without implementing the disclosed switches SS, SB, capacitive loading at global lines may increase according to a number of subsets of memory cells, as shown in cases 710. For example, without the disclosed switches SS, SB, the global lines may have a high capacitance loading 715, if a memory array 210 includes 64 number of subsets of memory cells. By implementing the switches SW (e.g., SS, SB), capacitive loadings at global lines may not increase despite the increased number of subsets of memory cells, as shown in cases 720. For example, a global line may have a capacitive loading corresponding to a selected subset 310 of memory cells by enabling switches SS, SB connected to the selected subset 310 of memory cells and disabling switches SS, SB connected to the unselected subsets 310 of memory cells. Accordingly, the increased number of subsets of memory cells may not affect the capacitive loading at the global lines.

Figure 8:
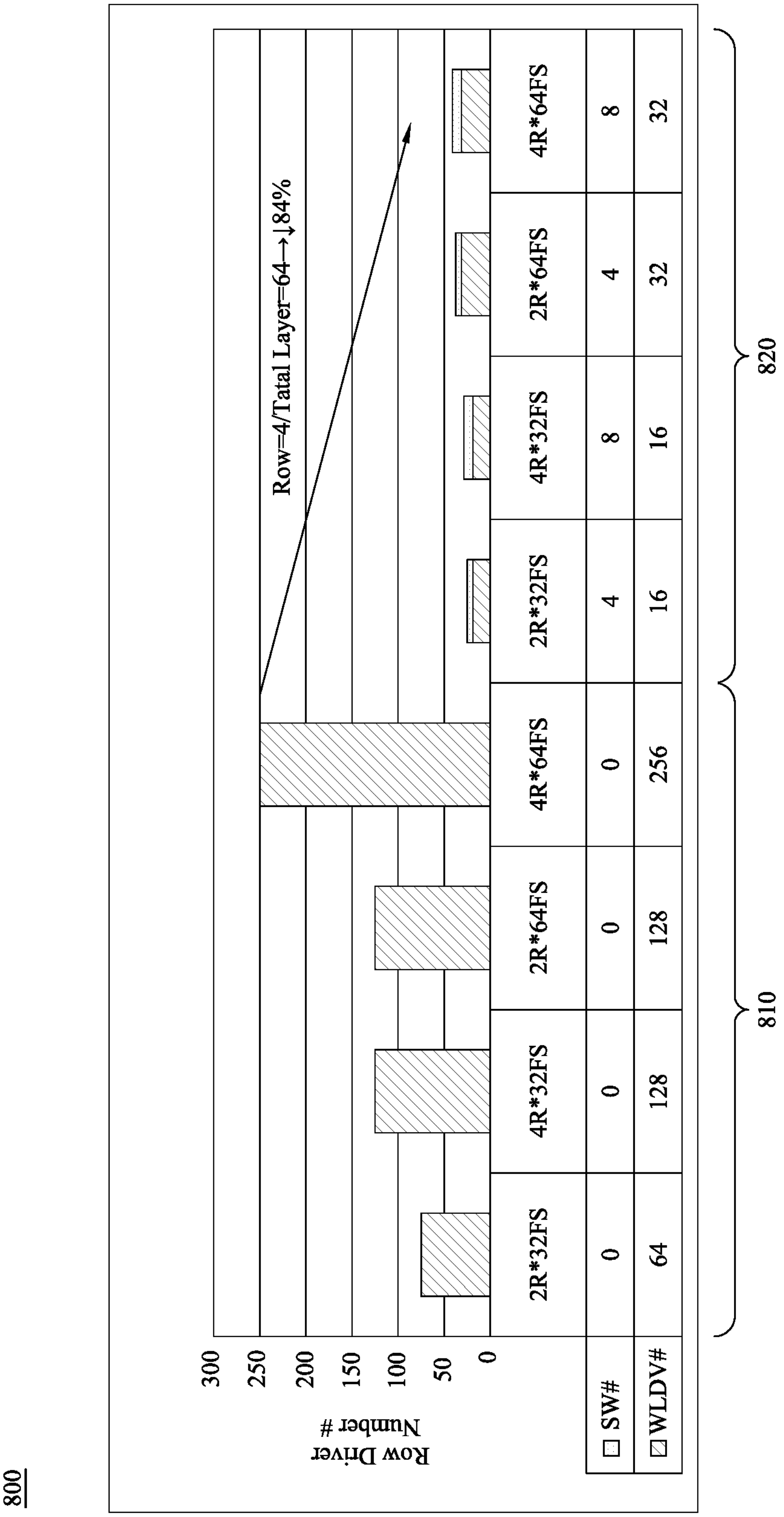
FIG. 8 is a plot showing reduction in area by employing common drivers, in accordance with one embodiment.

FIG. 8 is a plot 800 showing reduction in area by employing common drivers, in accordance with one embodiment. Without implementing the disclosed switches SS, SB, a number of drivers may correspond to a number of total memory cells in a set of memory cells as shown in cases 810. For example, without implementing the disclosed switches SS, SB, 256 number of drivers may be implemented to individually control or operate 256 number of memory cells. By implementing the switches SW (e.g., SS, SB) and sharing drivers D, DS, as described above with respect to FIG. 5, a number of drivers to drive memory cells can be significantly reduced. For example, by sharing drivers D, DS, for four number of subsets of memory cells having a total of 256 number of memory cells, eight number of drivers can be implemented to drive switches SS, SB and 32 number of drivers can be implemented to drive memory cells, instead of 256 number of drivers. Hence, 84% of area reduction can be achieved by sharing the drivers D, DS.

Figure 9:
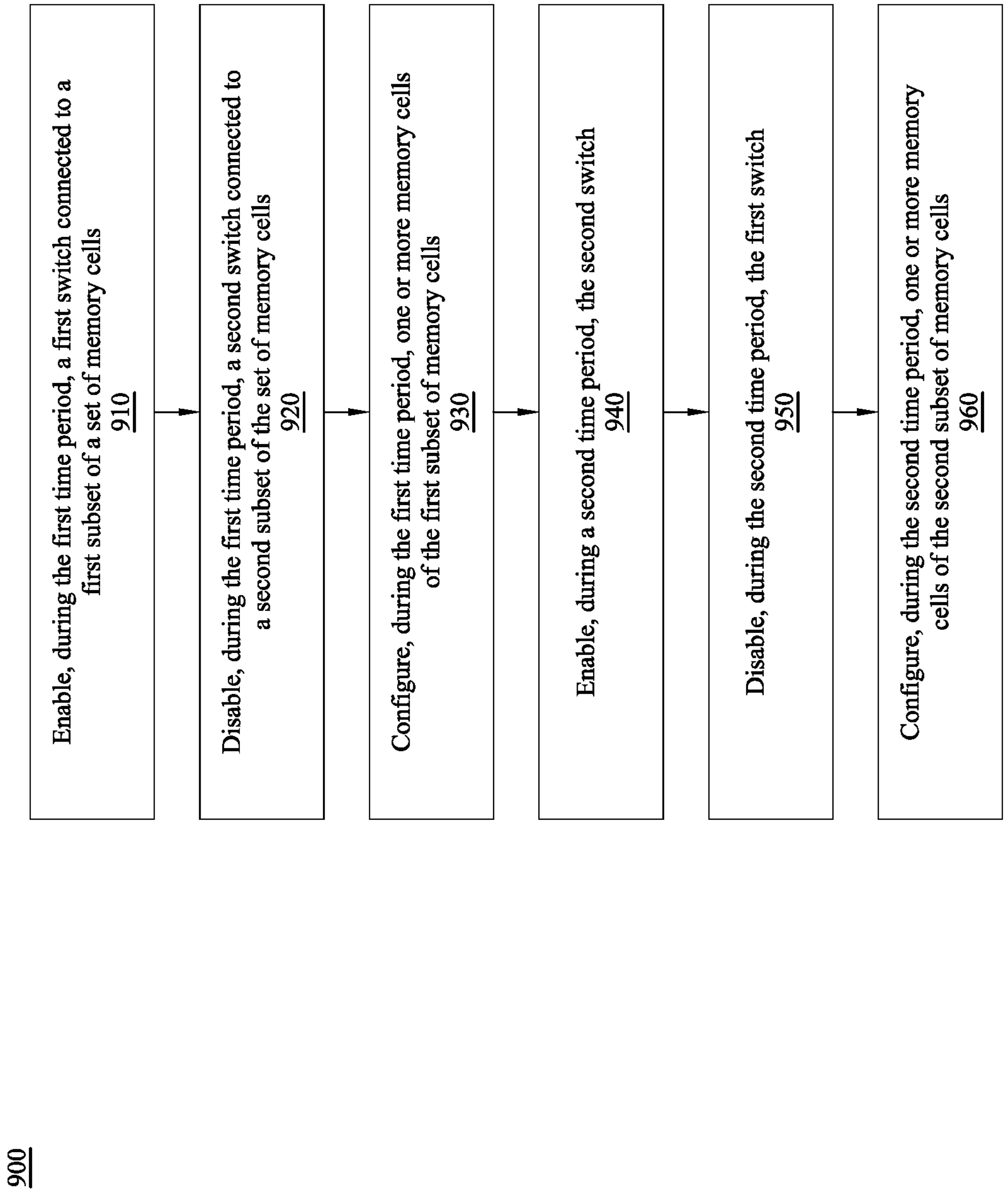
FIG. 9 is a flowchart showing a method of operating a memory cell, in accordance with some embodiments.

FIG. 9 is a flowchart showing a method 900 of configuring or operating a memory cell (e.g., memory cell 125), in accordance with some embodiments. The method 900 may be performed by the memory controller 105 of FIG. 1. In some embodiments, the method 900 is performed by other entities. In some embodiments, the method 900 includes more, fewer, or different operations than shown in FIG. 9.

In an operation 910, the memory controller 105 enables, during a first time period, a first switch (e.g., SB, SS) connected to a first subset (e.g., 310[00]) of a set (e.g., 310[00] . . . 310[03]) of memory cells. By enabling the first switch, the first subset of memory cells may be electrically coupled to a global line. For example, switches SB, SS connected to the subset 310[00] of memory cells may be enabled, such that the subset 310[00] of memory cells can be electrically coupled to the global bit line BL[0] and the global select line SL[0] during the first time period.

In an operation 920, the memory controller 105 disables, during the first time period, a second switch (e.g., SB, SS) connected to a second subset (e.g., 310[01]) of the set (e.g., 310[00] . . . 310[03]) of memory cells. By disabling the second switch, the second subset of memory cells may be electrically decoupled from the global line. For example, switches SB, SS connected to the subset 310[01] of memory cells may be disabled, such that the subset 310[01] of memory cells can be electrically decoupled from the global bit line BL[0] and the global select line SL[0] during the first time period. In one approach, the memory controller 105 may disable switches (e.g., SB, SS) connected to other subsets (e.g., 310[02], 310[03]) of the set (e.g., 310[00] . . . 310[03]) of memory cells, such that the global line (e.g., BL[0], SL[0]) has a capacitive loading corresponding to the first subset (e.g., 310[00]) of memory cells instead of the entire set (e.g., 310[00] . . . 310[03]) of memory cells.

In an operation 930, the memory controller 105 configures, during the first time period, one or more memory cells of the first subset (e.g., 310[00]) of memory cells. For example, the memory controller 105 may apply a voltage, current, or pulse to one or more memory cells through word lines to program the one or more memory cells or cause the one or more memory cells to conduct current according to the programmed data. In one approach, the memory controller 105 may apply the voltage, current, or pulses to other memory cells in unselected subsets (e.g., 310[01] . . . 310[03]) of memory cells. Because the switches SB, SS connected to the unselected subsets of memory cells are electrically decoupled from the global lines BL, SL, the memory cells in the unselected subsets may not be programmed or may not conduct current despite the voltage, current, or pulses applied. Hence, memory cells in the selected subset (e.g., 310[00]) of memory cells can be configured.

In one approach, the memory controller 105 may enable, during the first time period, a third switch (e.g., SB, SS) connected to a third subset (e.g., 310[10]) of a set (e.g., 310[10] . . . 310[13]) of memory cells. The memory controller 105 may disable, during the first time period, a fourth switch (e.g., SB, SS) connected to a fourth subset (e.g., 310[11]) of the set (e.g., 310[10] . . . 310[13]) of memory cells. During the first time period, the memory controller 105 may disable other switches (e.g., SB, SS) connected other subsets (e.g., 310[12], 310[13]) of the set of memory cells. By enabling the third switch connected to the third subset (e.g., 310[10]) of memory cells and disabling other switches connected to other subsets (e.g., 310[11] . . . 310[13]) of the set of memory cells (e.g., 310[10] . . . 310[13]), the global line (e.g., BL[1], SL[1]) may have a capacitive loading corresponding to the third subset (e.g., 310[10]) of memory cells instead of the entire set (e.g., 310[10] . . . 310[13]) of memory cells. Moreover, one or more memory cells of the third subset (e.g., 310[10]) of memory cells can be configured or operated, while one or more memory cells of the first subset (e.g., 310[00]) of memory cells are configured or operated through shared word lines during the first time period.

In an operation 940, the memory controller 105 enables, during a second time period, the second switch (e.g., SB, SS) connected to the second subset (e.g., 310[01]) of the set (e.g., 310[00] . . . 310[03]) of memory cells. By enabling the second switch, the second subset (e.g., 310[01]) of memory cells may be electrically coupled to the global line. For example, switches SB, SS connected to the subset 310[01] of memory cells may be enabled, such that the subset 310[01] of memory cells can be electrically coupled to the global bit line BL[0] and the global select line SL[0] during the second time period.

In an operation 950, the memory controller 105 disables, during the second time period, the first switch (e.g., SB, SS) connected to the first subset (e.g., 310[00]) of the set (e.g., 310[00] . . . 310[03]) of memory cells. By disabling the first switch, the first subset (e.g., 310[00]) of memory cells may be electrically decoupled from the global line. For example, switches SB, SS connected to the subset 310[00] of memory cells may be disabled, such that the subset 310[00] of memory cells can be electrically decoupled from the global bit line BL[0] and the global select line SL[0]. In one approach, the memory controller 105 may disable switches (e.g., SB, SS) connected to other subsets (e.g., 310[02], 310[03]) of the set (e.g., 310[00] . . . 310[03]) of memory cells, such that the global line (e.g., BL[0], SL[0]) has a capacitive loading corresponding to the second subset (e.g., 310[01]) of memory cells instead of the entire set (e.g., 310[00] . . . 310[03]) of memory cells.

In an operation 960, the memory controller 105 configures, during the second time period, one or more memory cells of the second subset (e.g., 310[01]) of memory cells. For example, the memory controller 105 may apply a voltage, current, or pulse to one or more memory cells through word lines to program the one or more memory cells or cause the one or more memory cells to conduct current according to the programmed data. In one approach, the memory controller 105 may apply the voltage, current, or pulses to other memory cells in unselected subsets (e.g., 310[00], 310[02] . . . 310[03]) of memory cells. Because the switches SB, SS connected to the unselected subsets of memory cells are electrically decoupled from the global lines BL, SL, the memory cells in the unselected subsets may not be programmed or may not conduct current despite the voltage, current, or pulses applied through word lines. Hence, memory cells in the selected subset (e.g., 310[01]) of memory cells can be configured.

In one approach, the memory controller 105 may enable, during the second time period, the fourth switch (e.g., SB, SS) connected to the fourth subset (e.g., 310[11]) of the set (e.g., 310[10] . . . 310[13]) of memory cells. The memory controller 105 may disable, during the second time period, the third switch (e.g., SB, SS) connected to the third subset (e.g., 310[10]) of the set (e.g., 310[10] . . . 310[13]) of memory cells. During the second time period, the memory controller 105 may disable other switches (e.g., SB, SS) connected other subsets (e.g., 310[12], 310[13]) of the set of memory cells. By enabling the fourth switch connected to the fourth subset (e.g., 310[11]) of memory cells and disabling other switches connected to other subsets (e.g., 310[10], 310[12] . . . 310[13]) of the set of memory cells (e.g., 310[10] . . . 310[13]), the global line (e.g., BL[1], SL[1]) may have a capacitive loading corresponding to the fourth subset (e.g., 310[11]) of memory cells instead of the entire set (e.g., 310[10] . . . 310[13]) of memory cells. Moreover, one or more memory cells of the fourth subset (e.g., 310[11]) of memory cells can be configured or operated, while one or more memory cells of the second subset (e.g., 310[01]) of memory cells are configured or operated through shared word lines during the second time period.

Figure 10:
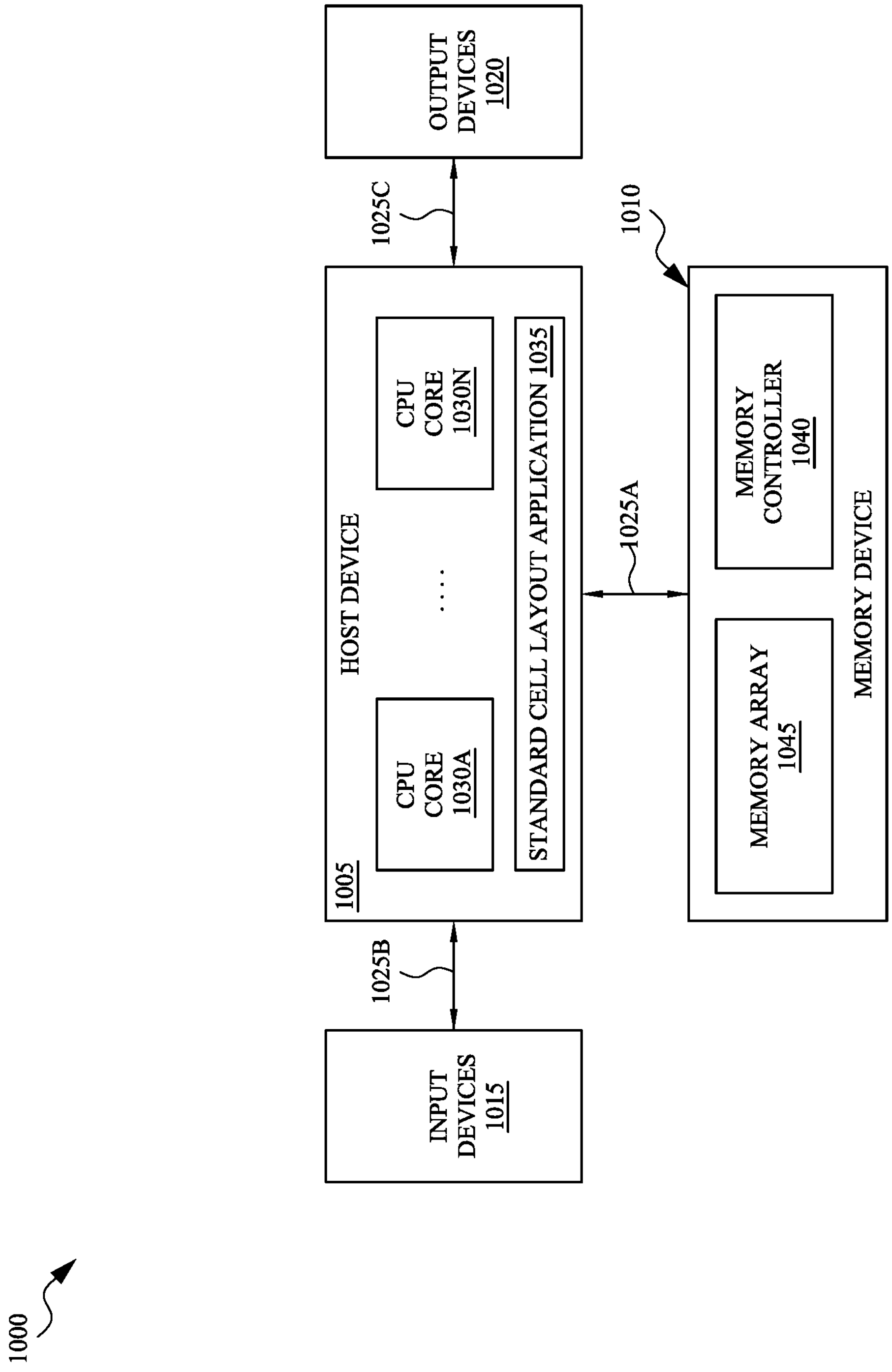
FIG. 10 is an example block diagram of a computing system, in accordance with some embodiments.

Referring now to FIG. 10, an example block diagram of a computing system 1000 is shown, in accordance with some embodiments of the disclosure. The computing system 1000 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1000 includes a host device 1005 associated with a memory device 1010. The host device 1005 may be configured to receive input from one or more input devices 1015 and provide output to one or more output devices 1020. The host device 1005 may be configured to communicate with the memory device 1010, the input devices 1015, and the output devices 1020 via appropriate interfaces 1025A, 1025B, and 1025C, respectively. The computing system 1000 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1005.

The input devices 1015 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1005 and that allows an external source, such as a user (e.g., a circuit or layout designer), to enter information (e.g., data) into the host device and send instructions to the host device. Similarly, the output devices 1020 may include a variety of output technologies such as external memories, printers, speakers, displays, microphones, light emitting diodes, headphones, video devices, and any other output peripherals that are configured to receive information (e.g., data) from the host device 1005. The "data" that is either input into the host device 1005 and/or output from the host device may include any of a variety of textual data, circuit data, signal data, semiconductor device data, graphical data, combinations thereof, or other types of analog and/or digital data that is suitable for processing using the computing system 1000.

The host device 1005 includes or is associated with one or more processing units/processors, such as Central Processing Unit ("CPU") cores 1030A-1030N. The CPU cores 1030A-1030N may be implemented as an Application Specific Integrated Circuit ("ASIC"), Field Programmable Gate Array ("FPGA"), or any other type of processing unit. Each of the CPU cores 1030A-1030N may be configured to execute instructions for running one or more applications of the host device 1005. In some embodiments, the instructions and data to run the one or more applications may be stored within the memory device 1010. The host device 1005 may also be configured to store the results of running the one or more applications within the memory device 1010. Thus, the host device 1005 may be configured to request the memory device 1010 to perform a variety of operations. For example, the host device 1005 may request the memory device 1010 to read data, write data, update or delete data, and/or perform management or other operations. One such application that the host device 1005 may be configured to run may be a standard cell application 1035. The standard cell application 1035 may be part of a computer aided design or electronic design automation software suite that may be used by a user of the host device 1005 to use, create, or modify a standard cell of a circuit. In some embodiments, the instructions to execute or run the standard cell application 1035 may be stored within the memory device 1010. The standard cell application 1035 may be executed by one or more of the CPU cores 1030A-1030N using the instructions associated with the standard cell application from the memory device 1010. In one example, the standard cell application 1035 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 10, the memory device 1010 includes a memory controller 1040 that is configured to read data from or write data to a memory array 1045. The memory array 1045 may include a variety of volatile and/or non-volatile memories. For example, in some embodiments, the memory array 1045 may include NAND flash memory cores. In other embodiments, the memory array 1045 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1045 may be individually and independently controlled by the memory controller 1040. In other words, the memory controller 1040 may be configured to communicate with each memory within the memory array 1045 individually and independently. By communicating with the memory array 1045, the memory controller 1040 may be configured to read data from or write data to the memory array in response to instructions received from the host device 1005. Although shown as being part of the memory device 1010, in some embodiments, the memory controller 1040 may be part of the host device 1005 or part of another component of the computing system 1000 and associated with the memory device. The memory controller 1040 may be implemented as a logic circuit in either software, hardware, firmware, or combination thereof to perform the functions described herein. For example, in some embodiments, the memory controller 1040 may be configured to retrieve the instructions associated with the standard cell application 1035 stored in the memory array 1045 of the memory device 1010 upon receiving a request from the host device 1005.

It is to be understood that only some components of the computing system 1000 are shown and described in FIG. 10. However, the computing system 1000 may include other components such as various batteries and power sources, networking interfaces, routers, switches, external memory systems, controllers, etc. Generally speaking, the computing system 1000 may include any of a variety of hardware, software, and/or firmware components that are needed or considered desirable in performing the functions described herein. Similarly, the host device 1005, the input devices 1015, the output devices 1020, and the memory device 1010 including the memory controller 1040 and the memory array 1045 may include other hardware, software, and/or firmware components that are considered necessary or desirable in performing the functions described herein.

One aspect of this description relates to a memory array. In some embodiments, the memory array includes a first set of memory cells including a first subset of memory cells and a second subset of memory cells. In some embodiments, the memory array includes a first switch including a first electrode connected to first electrodes of the first subset of memory cells, and a second electrode connected to a first global line. In some embodiments, the memory array includes a second switch including a first electrode connected to first electrodes of the second subset of memory cells, and a second electrode connected to the first global line.

One aspect of this description relates to a memory system. In some embodiments, the memory system includes a memory array and a controller. In some embodiments, the memory array includes a first set of memory cells, a second set of memory cells, a first switch connected to the first set of memory cells, and a second switch connected to the second set of memory cells. In some embodiments, the controller is connected to the memory array. In some embodiments, the controller is to enable, during a first time period, the first switch while disabling the second switch to electrically couple the first set of memory cells to a first global select line and electrically decouple the second set of memory cells from the first global select line. In some embodiments, the controller is to enable, during a second time period, the second switch while disabling the first switch to electrically couple the second set of memory cells to the first global select line and electrically decouple the first set of memory cells from the first global select line.

One aspect of this description relates to a method of operating a memory system. In some embodiments, the method includes enabling, during a first time period, a first switch connected to first electrodes of a first set of memory cells to electrically couple the first electrodes of the first set of memory cells to a first global select line. In some embodiments, the method includes disabling, during the first time period, a second switch connected to first electrodes of a second set of memory cells to electrically decouple the first electrodes of the second set of memory cells from the first global select line. In some embodiments, the method includes enabling, during the first time period, a third switch connected to second electrodes of the first set of memory cells to electrically couple the second electrodes of the first set of memory cells to a first global bit line. In some embodiments, the method includes disabling, during the first time period, a fourth switch connected to second electrodes of the second set of memory cells to electrically decouple the second electrodes of the second set of memory cells from the first global bit line. In some embodiments, the method includes configuring, during the first time period, one or more memory cells of the first set of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array, comprising:

a first subset of memory cells;

a first switch including:

a first electrode connected to first electrodes of the first subset of memory cells, and a second electrode connected to a first global bit line; and a second switch including:

a first electrode connected to second electrodes of the first subset of memory cells, and a second electrode connected to a first global select line.

2. The memory array of claim 1, further comprising:

a second subset of memory cells;

a third switch including:

a first electrode connected to first electrodes of the second subset of memory cells, and a second electrode connected to the first global bit line; and a fourth switch including:

a first electrode connected to second electrodes of the second subset of memory cells, and a second electrode connected to a second global select line.

3. The memory array of claim 2, wherein the first subset of memory cells is vertically disposed below the second subset of memory cells.

4. The memory array of claim 3, wherein the first global select line is vertically below the first subset of memory cells, the first global bit line is vertically disposed above the first subset of memory cells, the second subset of memory cells is disposed vertically above the first global bit line, and the second global select line is disposed above the second subset of memory cells.

5. The memory array of claim 2, wherein the first global select line, the second global select line, and the first global bit line all extend along a first lateral direction.

6. The memory array of claim 5, further comprising:

a third subset of memory cells;

a fifth switch including:

a first electrode connected to first electrodes of the third subset of memory cells, and a second electrode connected to a second global bit line; and a sixth switch including:

a first electrode connected to second electrodes of the third subset of memory cells, and a second electrode connected to a third global select line.

7. The memory array of claim 6, wherein the third subset of memory cells are disposed next to the first subset of memory cells along a second lateral direction perpendicular to the first lateral direction.

8. The memory array of claim 6, wherein the second global bit line extends in parallel with the first global bit line, and the third global select line extends in parallel with the first global select line.

9. The memory array of claim 6, further comprising:

a fourth subset of memory cells;

a seventh switch including:

a first electrode connected to first electrodes of the fourth subset of memory cells, and a second electrode connected to the second global bit line; and an eighth switch including:

a first electrode connected to second electrodes of the fourth subset of memory cells, and a second electrode connected to a fourth global select line.

10. The memory array of claim 9, wherein the third global select line is vertically below the third subset of memory cells, the second global bit line is vertically disposed above the third subset of memory cells, the fourth subset of memory cells is disposed vertically above the second global bit line, and the fourth global select line is disposed above the fourth subset of memory cells.

11. The memory array of claim 2, wherein the first subset of memory cells have a first number of memory cells and the second subset of memory cells have a second number of memory cells, and wherein the first number is identical to the second number.

12. The memory array of claim 2, wherein the first subset of memory cells have a first number of memory cells and the second subset of memory cells have a second number of memory cells, and wherein the first number is different from the second number.

13. A memory array, comprising:

a first subset of memory cells;

a second subset of memory cells disposed above the first subset of memory cells;

a first switch coupling the first subset of memory cells to a first global line;

a second switch coupling the first subset of memory cells to a second global line;

a third switch coupling the second subset of memory cells to the second global line; and a fourth switch coupling the second subset of memory cells to a third global line;

wherein the first to third global lines all extend along a first lateral direction.

14. The memory array of claim 13, wherein the first global line is vertically below the first subset of memory cells, the second global line is vertically disposed above the first subset of memory cells, the second subset of memory cells is disposed vertically above the second global line, and the third global line is disposed above the second subset of memory cells.

15. The memory array of claim 13, further comprising:

a third subset of memory cells;

a fourth subset of memory cells disposed above the third subset of memory cells;

a fifth switch coupling the third subset of memory cells to a fourth global line;

a sixth switch coupling the third subset of memory cells to a fifth global line;

a seventh switch coupling the fourth subset of memory cells to the fifth global line; and an eighth switch coupling the fourth subset of memory cells to a sixth global line;

wherein the fourth to sixth global lines all extend along the first lateral direction.

16. The memory array of claim 15, wherein the fourth global line is vertically below the third subset of memory cells, the fifth global line is vertically disposed above the third subset of memory cells, the fourth subset of memory cells is disposed vertically above the fifth global line, and the sixth global line is disposed above the fourth subset of memory cells.

17. The memory array of claim 15, wherein the third subset of memory cells are disposed next to the first subset of memory cells along a second lateral direction perpendicular to the first lateral direction, and wherein the fourth subset of memory cells are disposed next to the second subset of memory cells along the second lateral direction.

18. A memory array, comprising:

a first subset of memory cells vertically arranged with respect to one another;

a second subset of memory cells vertically arranged with respect to one another, the second subset of memory cells is vertically disposed above the first subset of memory cells;

a first switch coupling the first subset of memory cells to a first global line, the first global line vertically disposed below the first subset of memory cells;

a second switch coupling the first subset of memory cells to a second global line, the second global line vertically disposed above the first subset of memory cells;

a third switch coupling the second subset of memory cells to the second global bit line; and a fourth switch coupling the second subset of memory cells to a third global line, the third global line vertically disposed above the second subset of memory cells;

wherein the first to third global lines all extend along a first lateral direction.

19. The memory array of claim 18, wherein the first subset of memory cells have a first number of memory cells and the second subset of memory cells have a second number of memory cells, and wherein the first number is identical to the second number.

20. The memory array of claim 18, wherein the first subset of memory cells have a first number of memory cells and the second subset of memory cells have a second number of memory cells, and wherein the first number is different from the second number.

* * * * *